US012567290B1

(12) United States Patent

Patel et al.

(10) Patent No.: US 12,567,290 B1

(45) Date of Patent: Mar. 3, 2026

(54) SYSTEMS AND METHODS FOR USE IN CLOUD-BASED DIGITAL VEHICLE ALERTING

(71) Applicant: HAAS, Inc., Chicago, IL (US)

(72) Inventors: Jigar Patel, Arlington Heights, IL (US); Cory Hohs, Chicago, IL (US)

(73) Assignee: HAAS, Inc., Chicago, IL (US)

( * ) Notice: Subject to any disclaimer, the term of this patent is extended or adjusted under 35 U.S.C. 154(b) by 54 days.

(21) Appl. No.: 18/821,141

(22) Filed: Aug. 30, 2024

(51) Int. Cl.
    *G08G 1/00*        (2006.01)
    *G01R 19/165*    (2006.01)
    *G07C 5/00*      (2006.01)

(52) U.S. Cl.
    CPC ....... *G07C 5/008* (2013.01); *G01R 19/16576* (2013.01)

(58) Field of Classification Search
    CPC .............. G07C 5/008; G01R 19/16576; G08G 1/0965; G08G 1/096827; G08G 1/205; B60Q 1/26; B60Q 1/2611; G01C 21/3415
    USPC ................ 340/901, 902, 903, 904, 435, 436
    See application file for complete search history.

(56) References Cited

U.S. PATENT DOCUMENTS

| | | | |
|---|---|---|---|
| 5,422,623 A * | 6/1995 | Bader ................... | B60Q 1/2611 |
| | | | 340/331 |
| 7,271,736 B2 * | 9/2007 | Siegel ................... | G08G 1/0965 |
| | | | 340/902 |
| 8,466,805 B2 | 6/2013 | Waymire | |
| 11,693,470 B2 | 7/2023 | Srinivasan et al. | |
| 12,033,506 B1 | 7/2024 | Deyaf et al. | |
| 2012/0074869 A1 * | 3/2012 | Cronmiller ............ | H05B 45/10 |
| | | | 315/295 |
| 2012/0313792 A1 | 12/2012 | Behm et al. | |
| 2013/0027221 A1 * | 1/2013 | Johnson ................. | G08G 1/087 |
| | | | 340/902 |
| 2015/0254978 A1 | 9/2015 | Mawbey et al. | |

(Continued)

FOREIGN PATENT DOCUMENTS

CN         116887470 A     10/2023

OTHER PUBLICATIONS

International Search Report and Written Opinion for Application No. PCT/US2025/044303, dated Nov. 17, 2025, 8 pages.

(Continued)

*Primary Examiner* — Anh V La

(74) *Attorney, Agent, or Firm* — LOZA & LOZA, LLP

(57) ABSTRACT

Systems and methods for use in cloud-based digital vehicle alerting are disclosed. In an example, a device includes a global positioning system (GPS) unit, a wireless transmitter, an input voltage interface, a voltage detector circuit electrically connected to the input voltage interface and configured to detect a voltage at the input voltage interface, and alerting mode logic configured to transition from a non-alerting mode to an alerting mode in response to the voltage detected by the voltage detector circuit exceeding a threshold voltage, and transition from the alerting mode back to the non-alerting mode in response to the voltage detected by the voltage detector circuit not exceeding the threshold voltage for an entire delay interval, where the wireless transmitter is configured to transmit alerting vehicle telemetry data, which includes location information generated by the GPS unit, in response to the alerting mode of the alerting mode logic.

20 Claims, 12 Drawing Sheets

700

(56)        References Cited

U.S. PATENT DOCUMENTS

2016/0253903 A1\*  9/2016  Wilk ..................... G08G 1/087
                                                    340/902
2023/0124536 A1    4/2023  Chien et al.

OTHER PUBLICATIONS

Li, Haijian et al., "A Survey of Safety Warnings Under Connected Vehicle Environments", IEEE Transactions on Intelligent Transportation Systems; vol. 22, Issue 5; May 2021; https://ieeexplore.ieee.org/document/9215015; 2 pages (Abstract Only).

Cameron, Robert, "Emergency Warning Light Technology", Whelen Engineering; pp. 52-58; Last accessed Sep. 2024; https://onlinepubs.trb.org/Onlinepubs/trcircular/475/475-008.pdf; 7 pages.

Emergency Vehicle Warning System (HAAS Alert) Virtual Technology Demonstration Report; National Urban Security Technology Laboratory, U.S. Department of Homeland Security, Science and Technology Directorate; Jul. 2021; https://www.dhs.gov/sites/default/files/publications/emergency_vehicle_warning_haas_report_final_20july2021-508_0.pdf; 34 pages.

Sumathy, B. et al., "Vehicle Accident Emergency Alert System", IOP Conference Series: Materials Science and Engineering; vol. 1012; Oct. 2-3, 2020; https://iopscience.iop.org/article/10.1088/1757-899X/1012/1/012042; 14 pages.

\* cited by examiner

Figures 3B, 3C:
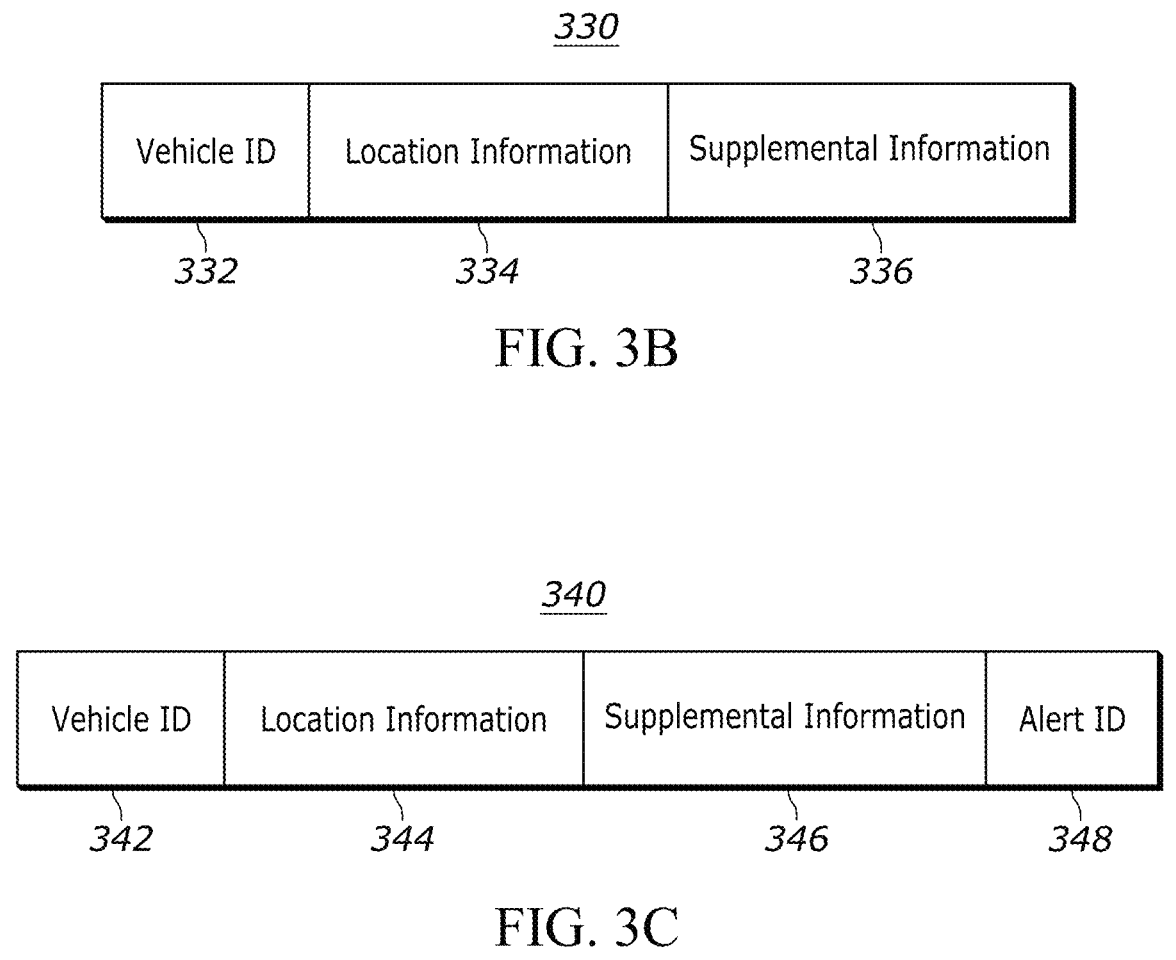

_330_

| Vehicle ID | Location Information | Supplemental Information |
|---|---|---|
| 332 | 334 | 336 |

| Vehicle ID | Location Information | Supplemental Information | Alert ID |
|---|---|---|---|
| 342 | 344 | 346 | 348 |

SYSTEMS AND METHODS FOR USE IN CLOUD-BASED DIGITAL VEHICLE ALERTING

BACKGROUND

Digital alerting is being used to improve roadway safety. Cloud based safety systems are being used to track in real time the overlap of alerting zones and vehicles that may benefit from an alerting of a possible road hazard. In some digital alerting systems, the state of the warning lights on a vehicle, such as a police car, a fire truck, or an ambulance, is an important factor in determining when and where to send digital alerts. However, obtaining a signal that is indicative of the state of a vehicles warning lights may not be a trivial task.

SUMMARY

Systems and methods for use in cloud-based digital vehicle alerting are disclosed. In an example, a device includes a global positioning system (GPS) unit, a wireless transmitter, an input voltage interface, a voltage detector circuit electrically connected to the input voltage interface and configured to detect a voltage at the input voltage interface, and alerting mode logic configured to transition from a non-alerting mode to an alerting mode in response to the voltage detected by the voltage detector circuit exceeding a threshold voltage, and transition from the alerting mode back to the non-alerting mode in response to the voltage detected by the voltage detector circuit not exceeding the threshold voltage for an entire delay interval, where the wireless transmitter is configured to transmit alerting vehicle telemetry data, which includes location information generated by the GPS unit, in response to the alerting mode of the alerting mode logic.

In an example, the alerting vehicle telemetry data includes a value that is indicative of the alerting mode.

In an example, the alerting vehicle telemetry data includes a value that is indicative of a state of a warning light in response to the alerting mode of the alerting mode logic, wherein, when the alerting mode logic is in the non-alerting mode, the value indicates that the warning light is off, and when the alerting mode logic is in the alerting mode, the value indicates that the warning light is on.

In an example, the voltage detector circuit is configured to generate a signal that indicates the voltage detected by the voltage detector circuit has exceeded the threshold voltage, and generate a signal that indicates the voltage detected by the voltage detector circuit has dropped below the threshold voltage.

In an example, the device further includes a timer to track time that has elapsed since the voltage detected by the voltage detector circuit dropped below the voltage threshold.

In an example, the alerting vehicle telemetry data is transmitted in vehicle data messages and more vehicle data messages are transmitted per unit of time when in the alerting mode than when in the non-alerting mode.

In an example, the delay interval is configured to be longer than a period of a periodic light driver signal.

In an example, the input voltage interface is configured to connect to a wire that carries a light driver signal for a warning light of a vehicle.

In an example, the alerting mode logic is further configured to transmit a value in a vehicle data message that is indicative of the alerting mode of the alerting mode logic.

In an example, the device further includes a body, wherein the GPS unit, the wireless transmitter, the voltage detector circuit, and the alerting mode logic are embedded within the body, and wherein the input voltage interface includes an electrical connector that is accessible from outside of the body.

An example of a method is also disclosed. The method involves receiving a voltage at an input interface of a device, transitioning alerting mode logic of the device from a non-alerting mode to an alerting mode in response to the voltage, which is received at the input interface and detected by a voltage detector, exceeding a threshold voltage, transitioning the alerting mode logic of the device from the alerting mode back to the non-alerting mode in response to the voltage, which is received at the input interface and detected by the voltage detector, not exceeding the threshold voltage for an entire delay interval, and transmitting alerting vehicle telemetry data, which includes location information generated by a GPS unit of the device, in response to the alerting mode of the alerting mode logic.

In an example, the voltage is an oscillating voltage of a light driver signal and the delay interval is at least longer than one period of the oscillating voltage.

In an example, the alerting vehicle telemetry data includes a value that is indicative of the alerting mode and the location information includes latitude and longitude coordinates of the vehicle.

In an example, the alerting vehicle telemetry data includes a value that is indicative of a state of a warning light in response to the alerting mode of the alerting mode logic, wherein, when the alerting mode logic is in the non-alerting mode, the value indicates that the warning light is off, and when the alerting mode logic is in the alerting mode, the value indicates that the warning light is on.

In an example, the voltage detector circuit is configured to generate a signal that indicates the voltage detected by the voltage detector circuit has exceeded the threshold voltage, and generate a signal that indicates the voltage detected by the voltage detector circuit has dropped below the threshold voltage.

In an example, the method further involves tracking time that has elapsed since the voltage detected by the voltage detector circuit dropped below the voltage threshold.

In an example, the alerting vehicle telemetry data is transmitted in vehicle data messages and more vehicle data messages are transmitted per unit of time when in the alerting mode than when in the non-alerting mode.

In an example, the delay interval is configured to be longer than a period of a periodic light driver signal.

Another example of a device is disclosed. The device includes a GPS unit, a wireless transmitter, an input voltage interface, a voltage detector circuit electrically connected to the input voltage interface and configured to detect a voltage at the input voltage interface, and a microcontroller configured to implement alerting mode logic that transitions from a non-alerting mode to an alerting mode in response to the voltage detected by the voltage detector circuit exceeding a threshold voltage, and transitions from the alerting mode back to the non-alerting mode in response to the voltage detected by the voltage detector circuit not exceeding the threshold voltage for an entire delay interval, and manage transmission of alerting vehicle telemetry data, which includes location information generated by the GPS unit, in response to the alerting mode of the alerting mode logic.

In an example, the alerting vehicle telemetry data includes a value that is indicative of a state of a warning light in response to the alerting mode of the alerting mode logic, wherein, when the alerting mode logic is in the non-alerting mode, the value indicates that the warning light is off, and when the alerting mode logic is in the alerting mode, the value indicates that the warning light is on, and the micro-controller is configured to cause vehicle data messages carrying alerting vehicle telemetry data to be transmitted at a first rate in non-alerting mode and to cause vehicle data messages carrying alerting vehicle telemetry data to be transmitted at a second rate in alerting mode, wherein the second rate is greater than the first rate, and the first and second rates correspond to a number of vehicle data messages per unit of time.

Other aspects in accordance with the invention will become apparent from the following detailed description, taken in conjunction with the accompanying drawings, illustrated by way of example of the principles of the invention.

BRIEF DESCRIPTION OF THE DRAWINGS

FIG. 3B is an example of a vehicle data message that is used to communicate vehicle telemetry data from a vehicle to the vehicle tracking system and/or to a safety cloud.

FIG. 3C is an example of an alerting vehicle data message that is used to communicate alerting vehicle telemetry data from an alerting vehicle to the alert tracking system and/or to the safety cloud.

Throughout the description, similar reference numbers may be used to identify similar elements.

DETAILED DESCRIPTION

Figure 1:
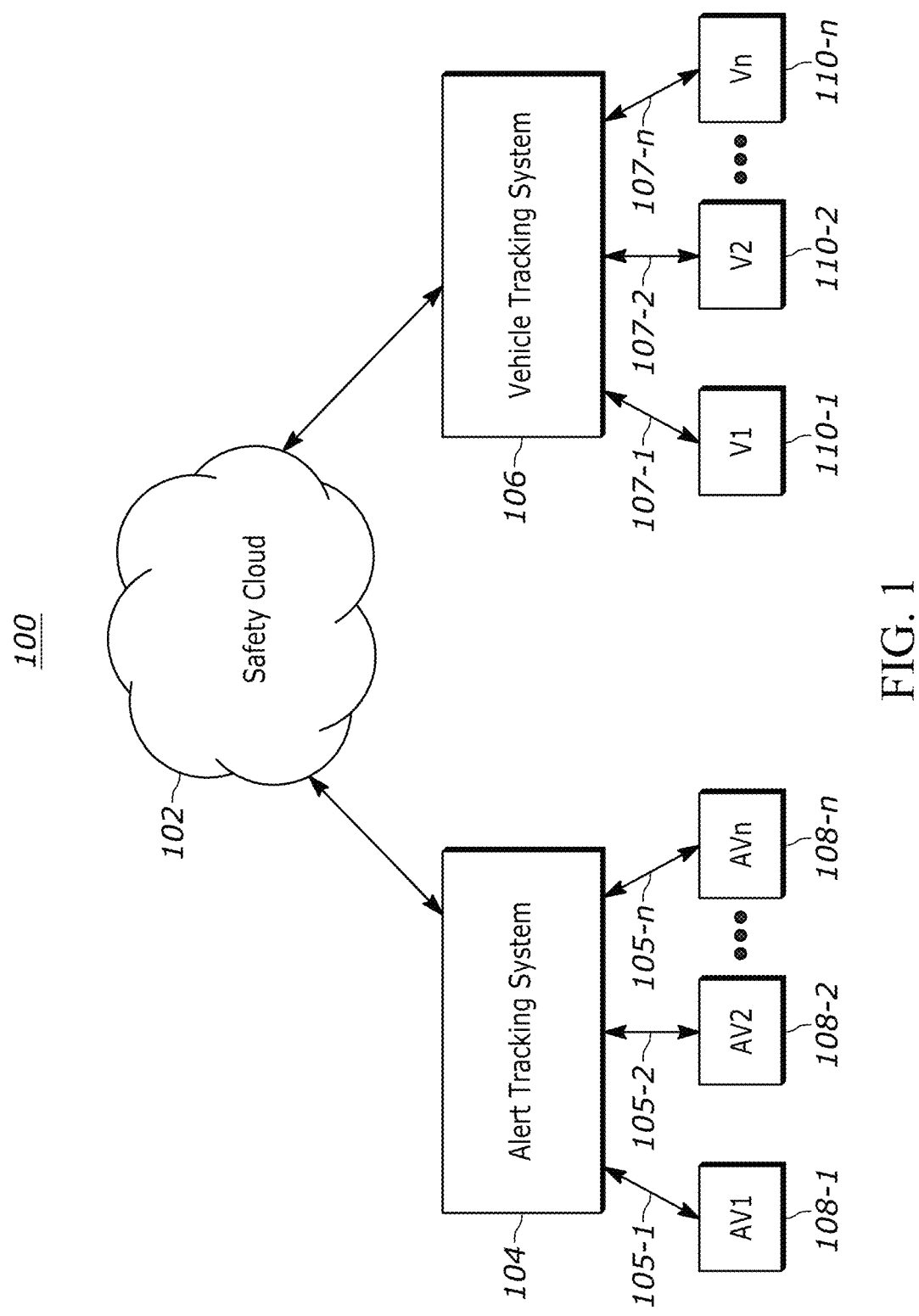
FIG. 1 is a high-level overview of a safety system for vehicle alerting.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

An "alerting zone" may be characterized as a geographical area near an alerting vehicle, near a route of the alerting vehicle, near a safety hazard (e.g., a construction zone, a car accident, a vehicle stopped along the side of the road, a lane closure, a road closure, etc.), or any combination thereof. Examples of an alerting zone may include, but are not limited to, a geographical area that covers a projected path of an alerting vehicle (plus X miles along each side of the path), a geographical area that surrounds an alerting vehicle (by X miles) and that changes as the alerting vehicle changes locations (e.g., travels along a projected path), or a geographical area that is within an X (X represents a positive value) mile radius of a safety hazard. In some examples, the geographical area of an alerting zone is defined by a set of geographical coordinates that are within a predetermined range of a particular location. In some embodiments, the geographical area may resemble a circle, an oval, a rectangle, a line, or other shape. In an embodiment, an alerting zone is determined by/in a safety cloud of a safety system. An example of a safety system is described in further detail with reference to FIG. 1.

FIG. 1 is a high-level overview of a safety system 100. The safety system 100 includes a safety cloud 102 that is connected to an alert tracking system 104 and to a vehicle tracking system 106. The safety cloud 102 may be implemented via software running on a computing system such as a remote server, a public cloud (e.g., Amazon Web Services (AWS), Google Cloud, Microsoft Azure, etc.), and/or a private cloud. In an embodiment, the safety cloud is implemented via a cloud computing system. The alert tracking system 104 and/or the vehicle tracking system 106 may be implemented via third-party computing systems, including for example, software running on a computing system such as a remote server, a public cloud, and/or a private cloud.

The alert tracking system 104 connects to one or more alerting vehicles (AVs), implemented as alerting vehicles AV1 108-1, AV2 108-2, and AVn 108-n (where n represents an integer of one or more), via, for example, a wireless service provider network (e.g., 3G, 4G, 5G, etc.). Alerting vehicles AV1 108-1, AV2 108-2, and AVn 108-n connect to the alert tracking system 104 over wireless connections via a first connection 105-1, a second connection 105-2, and an nth connection 105-n, respectively. Examples of the alerting vehicles include emergency vehicles (e.g., a police car, an ambulance, a firetruck, a military vehicle, or the like), safety vehicles (e.g., a construction vehicle, a towing vehicle, or the like), and/or other vehicles/devices that are capable of sending alerting vehicle data and/or connecting to the alert tracking system 104 over a wireless connection via a wireless service provider network. The alerting vehicles AVs 108-1, 108-2, and 108-n may be included in an emergency vehicle fleet (e.g., a fleet of police cars corresponding to a police department, a fleet of firetrucks corresponding to a fire department, etc.). In an embodiment, the AVs 108-1, 108-2, and 108-n are equipped with radios (e.g., a fixed radio and/or a mobile radio) to implement a wireless connection with a wireless service provider network. Although an alerting vehicle may commonly be a vehicle, the alerting vehicle may alternatively be an object with a radio that is capable of sending telemetry data and/or of connecting to the alert tracking system 104.

In an embodiment, alerting vehicles AV1 108-1, AV2 108-2, and AVn 108-n transmit alerting vehicle telemetry data to the alert tracking system 104. As an example, the alerting vehicle telemetry data may include a vehicle ID that corresponds to the vehicle (e.g., AV1 308-1, AV2 308-2, or AVn 308-n), location information (e.g., longitude and latitude coordinates) that corresponds to the location of the vehicle, a speed, acceleration, trajectory, direction, and/or azimuth of the vehicle, and an alert ID that indicates whether emergency lights of an alerting vehicle are on/off. In an example, the alerting vehicles transmit alerting vehicle telemetry data to the alert tracking system on regular intervals, such as 2 second intervals. In some examples, the interval may be different depending on the state of the alerting vehicle, for example, in a range of 1-20 second intervals. For example, an alerting vehicle may transmit vehicle telemetry data at shorter time intervals while the vehicle is in an alerting state (e.g., while its emergency lights are on).

The vehicle tracking system 106 connects to one or more vehicles (V), implemented as vehicles V1 110-1, V2 110-2, and Vn 110-n (n represents an integer greater than one), via a wireless service provider wireless network. Vehicles V1 110-1, V2 110-2, and Vn 110-n connect to the vehicle tracking system over wireless connections via a first connection 107-1, a second connection 107-2, and an nth connection 107-n, respectively. As described herein, a "vehicle" may refer to a civilian vehicles, a consumer vehicle, or more generally to a vehicle that is not configured as an alerting vehicle. For example, the vehicles V1 110-1, V2 110-2, and Vn 110-n are considered as "non-alerting" vehicles because the vehicles are not connected to the alert tracking system 104, the vehicles do not have emergency lights or a siren, and/or the vehicles are not configured to transmit an alert signal that indicates whether or not emergency lights and/or siren are on. The vehicles V1 110-1, V2 110-2, and Vn 110-n may be included in a vehicle fleet (e.g., a fleet of cars owned by a company). In an embodiment, the vehicles V1 110-1, V2 110-2, and Vn 110-n are equipped with radios (e.g., a fixed radio and/or a mobile radio) to implement a wireless connection to a wireless service provider network. In an embodiment, vehicles V1 110-1, V2 110-2, and Vn 110-n periodically send vehicle telemetry data to the vehicle tracking system 106 via the wireless service provider network. In an example, the vehicles transmit vehicle telemetry data to the vehicle tracking system on regular intervals, such as 2 second intervals. In some examples, the interval may be different depending on different factors, for example in a range of 1-20 second intervals. For example, a vehicle may transmit vehicle telemetry data at shorter time intervals while the vehicle is in an alerting zone. In an example, the vehicle telemetry data may include a vehicle ID that corresponds to the vehicle (e.g., V1 110-1, V2 110-2, or Vn 110-n), location information (e.g., longitude and latitude coordinates) that corresponds to the location of the vehicle, a speed, acceleration, trajectory, direction, and/or azimuth of the vehicle. Although vehicles V1 110-1, V2 110-2, and Vn 110-n may commonly be vehicles, the vehicles V1, V2, and/or Vn may also be an object such as a radio, a smartphone, or other similar device capable of sending telemetry data and/or of connecting to the vehicle tracking system 106.

In some embodiments, the safety cloud 102 receives alerting vehicle telemetry data from alerting vehicles AV1 108-1, AV2 108-2, and/or AVn 108-n via the alert tracking system 104, and receives vehicle telemetry data from vehicles V1 110-1, V2 110-2, and/or Vn 110-n via the vehicle tracking system 106. The safety cloud 102 may use the alerting vehicle telemetry data to determine an alerting zone that is associated with an alerting vehicle. The safety cloud 102 may use the vehicle telemetry data to determine whether any non-alerting vehicles are located in the alerting zone, and to determine whether or not to provide an alert to vehicles that are located in the alert zone, where the alert may indicate that there is a potential hazard nearby.

Cloud based safety systems, similar to the system described with reference to FIG. 1, may establish an alerting zone relative to an alerting vehicle and then send alerts to non-alerting vehicles that are located within the alerting zone. A conventional way of establishing an alerting zone involves identifying a geographical area that covers a projected path of an alerting vehicle and/or a geographical area that surrounds the alerting vehicle.

Examples of how a cloud-based system can be used to alert vehicles of potential hazards is described with reference to FIGS. 2A, 2B, and 3A-3E.

Figure 2A:
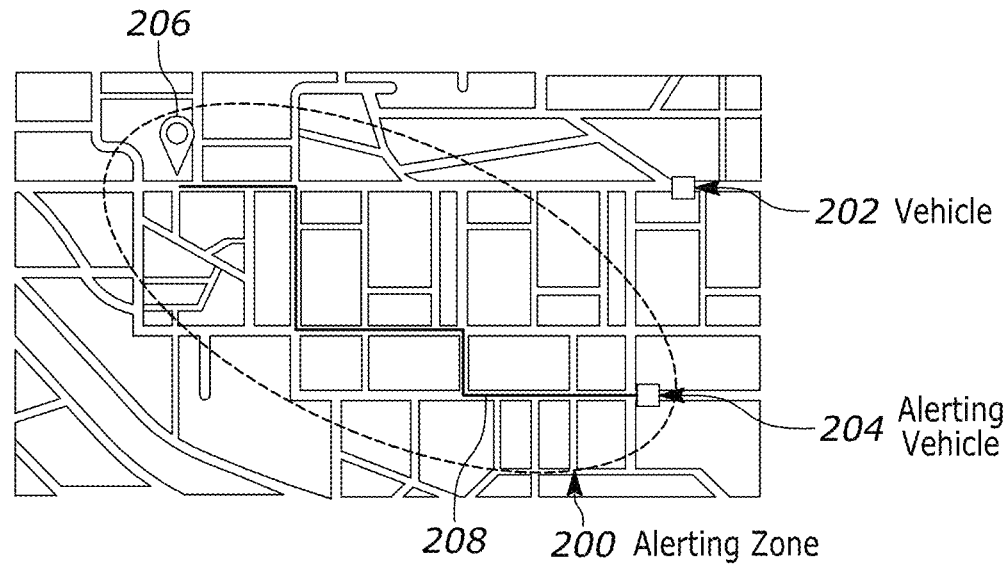
FIG. 2A depicts an example of a vehicle located outside an alerting zone.

FIG. 2A depicts an example of a vehicle 202 that is located outside of an alerting zone 200. In the example illustrated by FIG. 2A, the alerting zone 200 is a geographical area that surrounds an alerting vehicle 204. In the example, the alerting zone 200 is established in response to receiving an indication that an alerting vehicle has its warning lights on and includes a geographical area around a destination 206 of the alerting vehicle 204 and a projected path 208 of the alerting vehicle to the destination. The destination 206 may be, for example, an emergency site (e.g., a car accident, a structure fire, a crime site, or the like), a safety hazard (e.g., a weather hazard, a road closure, a lane closure, a road obstruction, or the like), or other similar destination. Because the vehicle 202 is located outside of the alerting zone 200, the safety cloud determines that the vehicle does not need to be alerted about the presence of the alerting vehicle 204. Thus, no alerting message is sent to the vehicle 202.

Figure 2B:
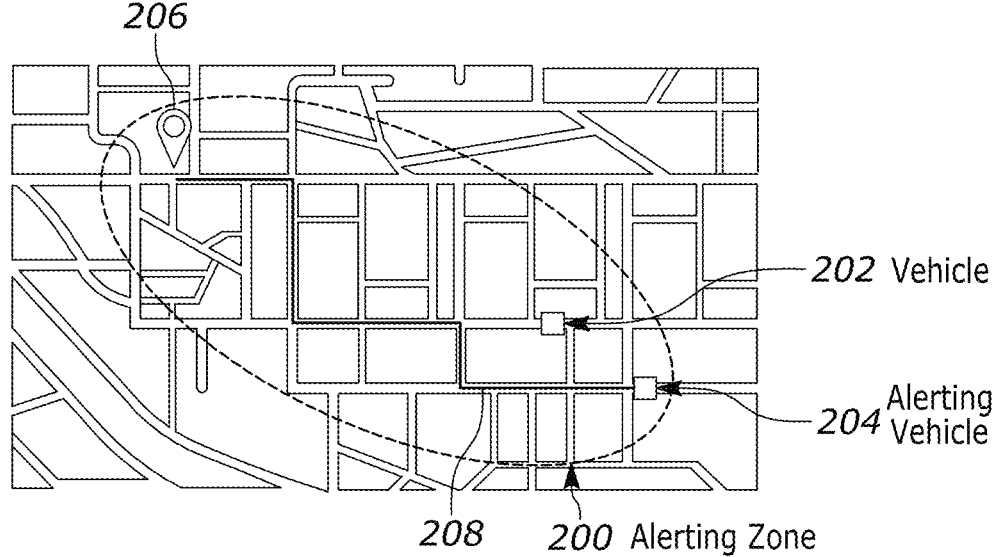
FIG. 2B depicts an example of a vehicle located in an alerting zone.

FIG. 2B depicts an example of the vehicle 202 being located in the alerting zone 200. In the example shown illustrated in FIG. 2B, the alerting zone 200 includes the alerting vehicle 204, the projected path 208 of the alerting vehicle, and the destination 206 of the alerting vehicle as described with reference to FIG. 2A. In contrast to FIG. 2A, the vehicle 202 shown in FIG. 2B is located in the alerting zone 200. Because the vehicle 202 is located in the alerting zone 200, the safety cloud determines that the vehicle needs to be alerted about the presence of the alerting vehicle 204. Thus, an alerting message is sent to the vehicle 202.

An example that illustrates the flow of data within a safety system, which is similar to the safety system 100 described with reference to FIG. 1, is described herein with reference to FIG. 3A-3E.

Figure 3A:
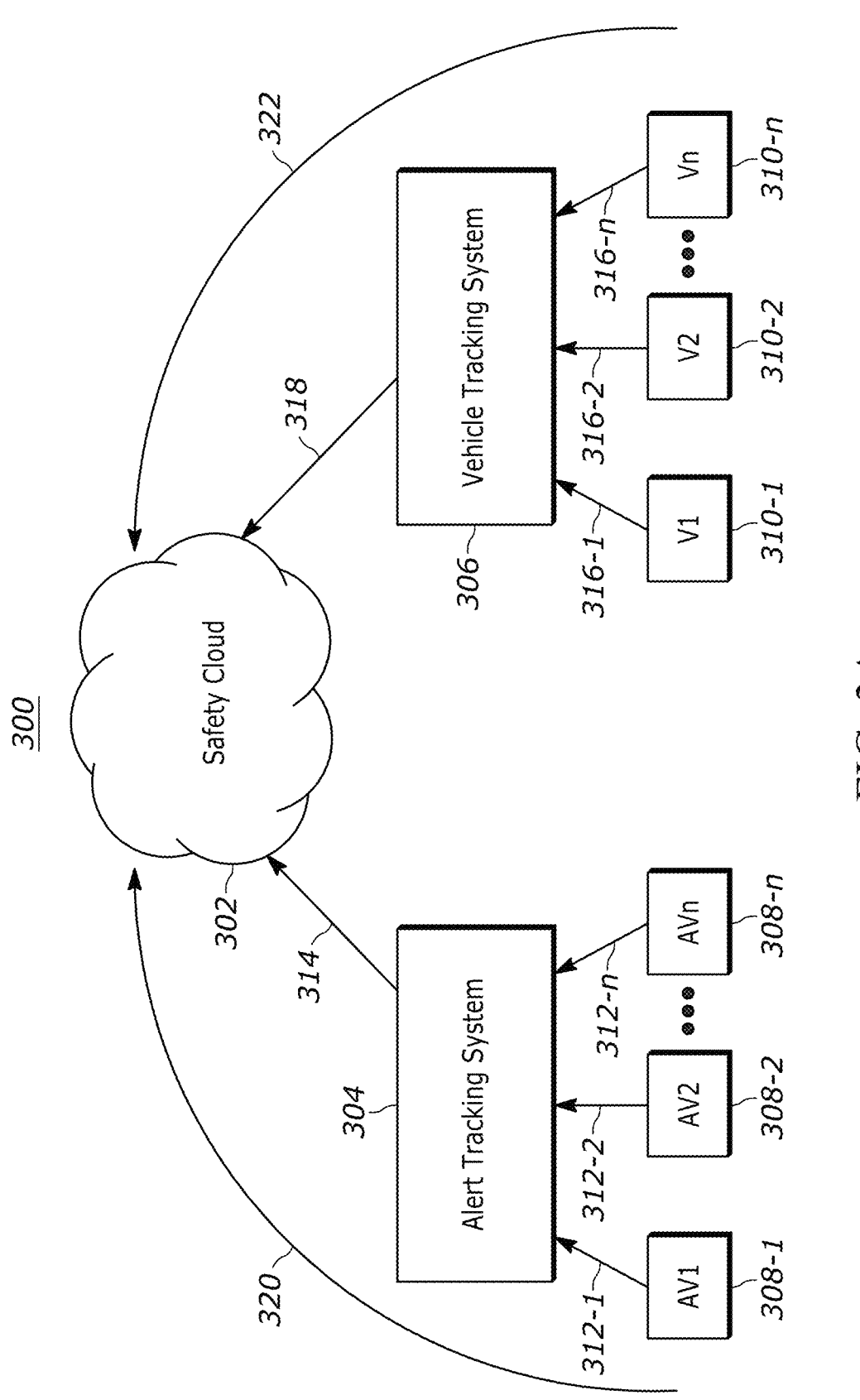
FIG. 3A illustrates the flow of data to a safety cloud.

FIG. 3A illustrates the flow of data to a safety cloud. The flow of data to the safety cloud may represent a process for collecting data (e.g., from alerting vehicles and from non-alerting vehicles). In particular, the example of FIG. 3A illustrates a safety system 300 that includes a safety cloud 302, an alert tracking system 304 that communicates with alerting vehicles AV1 308-1, AV2 308-2, and/or AVn 308-n, and a vehicle tracking system 306 that communicates with vehicles V1 310-1, V2 310-2, and/or Vn 310-n as described with reference to FIG. 1. The example of FIG. 3A illustrates the flow of data to the safety cloud 302. In an embodiment, alerting vehicles AV1 308-1, AV2 308-2, and/or AVn 308-n share alerting vehicle telemetry data with the alert tracking system 304 via wireless connections (represented by arrows 312-1, 312-2, and 312-n). In an example, the alerting vehicle telemetry data may include a vehicle ID, location information at a particular time (e.g., a timestamp and latitude and longitude coordinates), speed, acceleration, trajectory, direction, and/or azimuth, and an alert ID that corresponds to an alerting status/mode of an alerting vehicle, e.g., lights on/off. The alert tracking system 304 shares the alerting vehicle telemetry data with the safety cloud 302 (represented by arrow 314). In an embodiment, vehicles V1 310-1, V2 310-2, and/or Vn 310-n share vehicle telemetry data with the vehicle tracking system 306 at regular intervals (e.g., every 2 seconds) via wireless connections (represented by arrows 316-1, 316-2, and 316-n). In an example, the alerting vehicle telemetry data may include a vehicle ID, location information (e.g., timestamp and latitude and longitude coordinates), speed, acceleration, trajectory, direction, and/or azimuth, and an alert ID. The vehicle tracking system 306 shares the vehicle telemetry data with the safety cloud 302 (represented by arrow 318).

In some embodiments, alerting vehicles AV1 308-1, AV2 308-2, and/or AVn 308-n share alerting vehicle telemetry data directly with the safety cloud 302 (represented by arrow 320), and/or vehicle V1 310-1, V2 310-2, and/or Vn 310-n share vehicle telemetry data directly with the safety cloud 302 (represented by arrow 322). In such an embodiment, alerting vehicles AV1 308-1, AV2 308-2, and/or AVn 308-n share alerting vehicle telemetry data directly with the safety cloud 302 by bypassing the alert tracking system 304, and vehicles V1 310-1, V2 310-2, and/or Vn 310-n share vehicle telemetry data directly with the safety cloud 302 by bypassing the vehicle tracking system 306.

Although the alert tracking system 304 is described as sharing alerting vehicle telemetry data from alerting vehicles AV1 308-1, AV2 308-2, and/or AVn 308-n, the alert tracking system may also share vehicle telemetry data from other vehicles or devices (e.g., a roadside vehicle, a roadside sensor, a maintenance vehicle, a construction site device, drawbridge warning lights, railroad crossing gate/lights etc.). Additionally, the alerting vehicle telemetry data may correspond to other alert-related data such as, for example, a weather hazard, a lane closure, a road obstruction, a construction site, traffic, etc. In some embodiments, other parties may have access to the alert tracking system 304, such that the other parties (e.g., construction teams, utility teams, weather tracking teams, etc.) may tap into the alert tracking system and input/send alert-related data to the safety cloud 302 to indicate a safety hazard and/or an alerting zone. In such an embodiment, the other parties may input alert-related data that includes a specific location (e.g., an address or longitude and latitude coordinates) and/or a zone and an alert status (e.g., construction active, drawbridge up, railroad crossing gate down) to indicate the safety hazard and/or the alerting zone.

FIG. 3B is an example of a vehicle data message 330 that is used to communicate vehicle telemetry data from a vehicle (V1 310-1, V2 310-2, . . . . Vn 310-n) to the vehicle tracking system 306 and/or to the safety cloud 302. In the example, the vehicle data message 330 includes three fields, implemented as a vehicle ID field 332, a location information field 334, and a supplemental information field 336. The vehicle ID field 332 may indicate a vehicle ID (e.g., a 17-digit vehicle ID number (VIN)) that is unique to each vehicle (e.g., V1 310-1, V2 310-2, and/or Vn 310-n). The location information field 334 may indicate location information that corresponds to the location of the vehicle at a particular time, e.g., timestamp and latitude and longitude coordinates as provided from an on-vehicle GPS receiver). The supplemental information field 606 may include, for example, data indicative of motion of the vehicle such as speed, acceleration, trajectory, direction, and/or azimuth of the vehicle. Although the vehicle data message 330 is shown in FIG. 3B as including three fields, the vehicle data message may have more than or less than three fields that indicate the same or different information. In an embodiment, the vehicle data message 330 is sent by a vehicle (e.g., V1 310-1, V2 310-2, and/or Vn 310-n) to the vehicle tracking system 306 at regular intervals (e.g., every 2 seconds) via a wireless service provider network, and then shared with the safety cloud 302 by the vehicle tracking system. In another embodiment, the vehicle data message 330 is sent by a vehicle directly to the safety cloud via a wireless service provider network.

FIG. 3C is an example of an alerting vehicle data message 340 that is used to communicate alerting vehicle telemetry data from an alerting vehicle (AV1 308-1, AV2 308-2, . . . . AVn 308-n) to the alert tracking system 304 and/or to the safety cloud 302. In the example, the alerting vehicle data message 340 includes four fields, implemented as a vehicle ID field 342, a location information field 344, a supplemental information field 346, and an alert ID field 348. The vehicle ID field 342 may indicate a unique vehicle ID (e.g., a 17-digit vehicle ID number (VIN)) that corresponds to an alerting vehicle (e.g., AV1 308-1, AV2 308-2, and/or AVn 308-n). The location information field 344 may indicate location information that corresponds to the location of the vehicle (e.g., latitude and longitude coordinates as provided from an on-vehicle GPS receiver). The supplemental information field 346 may include, for example, data indicative of motion of the vehicle such as speed, acceleration, trajectory, direction, and/or azimuth of the vehicle. The alert ID field 348 may include an alert ID that indicates an alerting mode of the vehicle, e.g., whether the alerting vehicle has its emergency lights on or off and/or has its emergency siren on or off. In an example, the status of the emergency/warning lights of an alerting vehicle, as indicated by the value in the alert ID, is used to establish and remove alerting zones. For example, the safety cloud may establish an alerting zone and send alert messages accordingly when the value in the alert ID field indicates that the alerting vehicle has its warning lights on, and the safety cloud may end an alerting zone and the corresponding alerting when the value in the alert ID field indicates that the alerting vehicle no longer has its warning lights on. Although the alerting vehicle data message 340 is shown in FIG. 3C as including four fields, the alerting vehicle data message may have more than or less than four fields that indicate the same or different information. In an embodiment, the alerting vehicle data message 340 is sent by an alerting vehicle (e.g., AV1 308-1, AV2 308-2, and/or AVn 308-n) to the alert tracking system 304 via a wireless service provider network, and then shared with the safety cloud 302 by the alert tracking system. In another embodiment, the alerting vehicle data message 340 is sent by an alerting vehicle directly to the safety cloud 302 via a wireless service provider network.

Figure 3D:
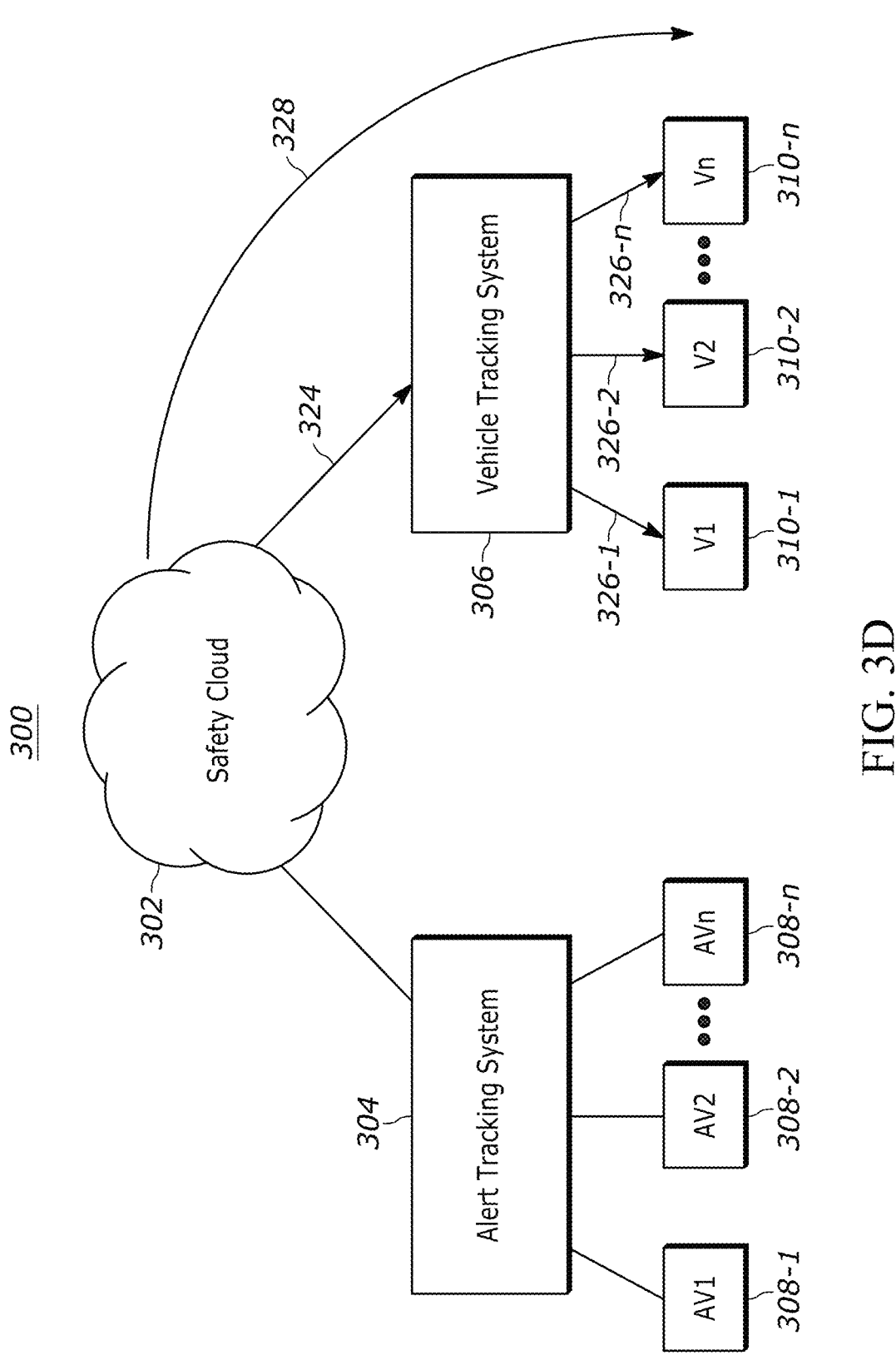
FIG. 3D illustrates the flow of data to vehicles from the safety cloud.

FIG. 3D illustrates the flow of data to vehicles. The flow of data to the vehicles may represent a process for sending alerts to the vehicles (V1 310-1, V2 310-2, and/or Vn 310-n). In particular, the example of FIG. 3D illustrates the safety system 300, including the safety cloud 302, the alert tracking system 304 that communicates with alerting vehicles AV1 308-1, AV2 308-2, and/or AVn 308-n, and the vehicle tracking system 306 that communicates with vehicles V1 310-1, V2 310-2, and/or Vn 310-n as described with reference to FIG. 3A. In contrast to FIG. 3A, the example of FIG. 3D illustrates the flow of data (e.g., alert messages) from the safety cloud 302 to the vehicles V1 310-1, V2 310-2, and/or Vn 310-n. The safety cloud 302 may generate an alert message for transmission to vehicles V1 310-1, V2 310-2, and/or Vn 310-n when a vehicle is within an alerting zone. In an example, the safety cloud 302 sends an alerting message to the vehicle tracking system 306 (represented by arrow 324) and the vehicle tracking system 306 sends an alert message to corresponding vehicles V1 310-1, V2 310-2, and/or Vn 310-n via wireless connections (represented by arrows 326-1, 326-2, and 326-n). In another example, the safety cloud 302 sends an alert message directly to a corresponding vehicle V1 310-1, V2 310-2, and/or Vn 310-n via a wireless connection (represented by arrow 328). In some embodiments, the same alert message is sent to all the vehicles that are included in the safety system 300 and within an active alerting zone. In some embodiments, an alert message is vehicle-specific, such that a different vehicle-specific alert message is sent to each of the vehicles that is within an alerting zone.

Figure 3E:
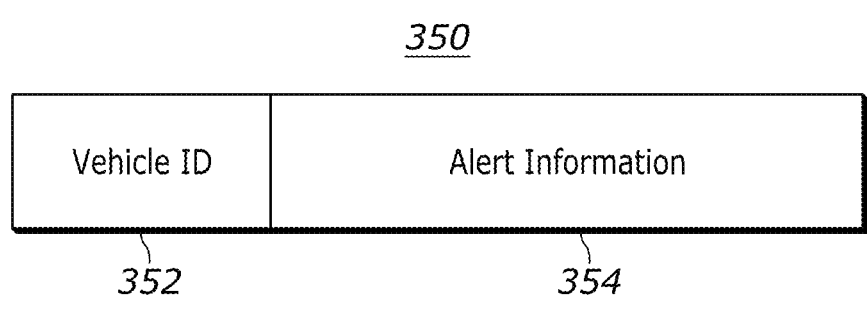
FIG. 3E depicts an example of an alert message that is generated by the safety cloud.

FIG. 3E depicts an example of an alert message 350 that is generated by the safety cloud 302. In the example, the alert message 350 shown in FIG. 3E includes two fields, implemented as a vehicle ID field 352 and an alert information field 354. The vehicle ID field 352 may indicate a vehicle ID that is unique to each vehicle (e.g., V1 310-1, V2 310-2, and/or Vn 310-n), such that the vehicle ID is vehicle-specific. By using the vehicle ID, the alert message indicates which particular vehicle the alert message is intended for. Thus, the vehicle ID may improve the overall impact of alert messages because only the intended vehicle will recognize the alert as being intended specifically for that vehicle. The alert information field 354 may indicate an alert type. In one example, the alert information field 354 may be a single bit field and in other examples, the alert information field 354 may be a multibit field. In one example, there may be multiple different types of alert messages and in another example, there is only one type of alert message. In an embodiment, the alert information field 354 has a value that indicates a warning such as "beware of hazard," "fire truck ahead," "police car ahead," "tow truck ahead," "lane closure ahead," "construction ahead," or the like. Although the alert message 350 is shown in FIG. 3E as including two fields, the alert message may have more than or less than two fields that indicate the same or different information. In an embodiment, the alert message 350 is sent to the vehicle tracking system 306 by the safety cloud 302, and then sent by the vehicle tracking system to a transceiver of a vehicle (e.g., V1 310-1, V2 310-2, and/or Vn 310-n) via a wireless service provider network. In another embodiment, the alert message 350 is sent by the safety cloud to the transceiver of the vehicle via the wireless service provider network. In yet another embodiment, the alert message 350 is sent by the safety cloud to a broadcasting tower near an alerting zone via the wireless service provider network, and then sent by the broadcasting tower to the transceiver of the vehicle via a wireless service provider network.

As described above, the reporting of alerting vehicle telemetry data may include an indication of the alerting mode of a vehicle, which may include an indication of the state of warning lights of a vehicle such as a police car, a fire truck, an ambulance, or a tow truck. One way to know the state of the warning lights of a vehicle is to obtain an activation state signal from a light controller of the vehicle or to obtain an activation state signal from the warning lights themselves. However, obtaining such an activation state signal may not be a trivial task and may require an additional signal path or access to the inner workings of the warning lights or to the light controller. Another way to obtain the state of the warning lights is to simply tap into the light driver signal that is generated by the light controller and received by the warning lights. In this case, an alerting mode can be triggered upon detecting a voltage of the light driver signal. However, in some cases the light driver signal may be a voltage that oscillates between on and off states to produce a particular flashing pattern in the light. When the light driver signal oscillates between on and off states, the voltage of the light driver signal at a particular moment in time may not be a useful indicator of the activation state of the warning lights.

It has been realized that an oscillating light driver signal can be used as an indication of the activation state of a warning light for use in digital alerting by delaying a decision to transition from an alerting mode back to a non-alerting mode for a period of time that accounts for the oscillating nature of the light driver signal. For example, a delay interval that spans multiple on/off cycles of an oscillating light driver signal is used to ensure that a digital alerting device does not transition to a non-alerting mode each time the oscillating light driver signal goes low. In an example, a device is connectable to a light driver signal that drives a warning light of a vehicle and the device includes a global positioning system (GPS) unit, a wireless transmitter, an input voltage interface, a voltage detector circuit electrically connected to the input voltage interface and configured to detect a voltage at the input voltage interface, and alerting mode logic that is configured to transition from a non-alerting mode to an alerting mode in response to the voltage detected by the voltage detector circuit exceeding a threshold voltage, and to transition from the alerting mode back to the non-alerting mode in response to the voltage detected by the voltage detector circuit not exceeding the threshold voltage for an entire delay interval, and the wireless transmitter is configured to transmit alerting vehicle telemetry data, which includes location information generated by the GPS unit, in response to the alerting mode of the alerting mode logic. Because the alerting mode logic of the device is configured to transition back to the non-alerting mode in response to the detected voltage not exceeding the threshold voltage for an entire delay interval, a light driver signal that oscillates between high and low voltages can be used to determine an activation state of a warning light, which in turn can be used for digital alerting to, for example, direct the transmission of alerting vehicle telemetry data and/or to trigger the establishment and removal of alerting zones for digital alerting.

Figure 4:
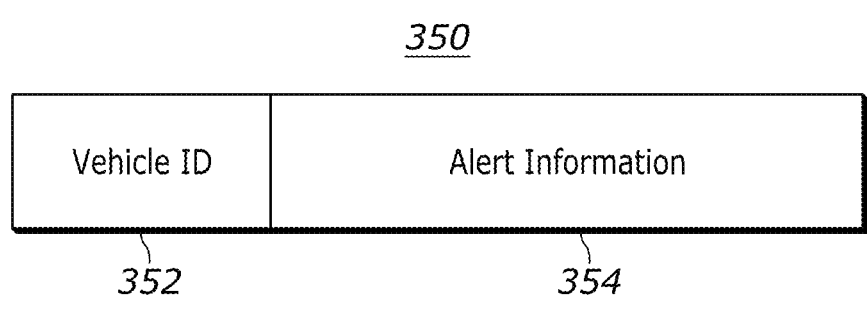
FIG. 4 is an example of a functional block diagram of components of an alerting vehicle.

In an example, a device that manages the transmission of alerting vehicle telemetry data to the safety cloud is installed in an alerting vehicle. FIG. 4 is an example of a functional block diagram of components of an alerting vehicle 456 in which the components include a warning light system 458 having a warning light 460 and a light controller 462, a battery 464, and a device 466 that is configured to manage the transmission of alerting vehicle telemetry data to the safety cloud. In operation, the device is installed in an alerting vehicle, such as a police car, a fire truck, an ambulance, or a tow truck.

In an example, the warning light 460 of the light system 458 includes a light or a set of lights that emit light in response to the light driver signal. In an example, the warning light is a set of lights, such as LED lights as is known in the field. The warning light may produce, for example, white light, red light, blue light, and/or yellow light as is known in the field. Other types of lights and colors of light are possible.

In an example, the light controller 462 of the light system 458 is a component that controls the generation and delivery of the light driver signal. The light controller receives power from the battery 464 and may include a switch circuit and/or an oscillator circuit as is known in the field. In an example, the light controller receives a DC voltage from the battery and outputs a light driver signal that has a DC voltage that varies between a low voltage (e.g., 0 V) and a high voltage (e.g., 12 V) in a pattern that is configured to produce a desired flashing light pattern. In addition, the light controller may include a user interface 463 that enables the light system to be turned on and off, e.g., to be put into an activation state (light on) or into a non-activation state (light off). The user interface may include an on/off switch that is manipulated by an operator of the alerting vehicle. The on/off switch may be a physical switch inside the alerting vehicle or the on/switch may be a soft switch that is displayed on a touch screen. Other user interfaces that control the activation state of the warning light system are possible.

In an example, the battery 464 is a battery that is installed within the alerting vehicle 456. The battery may be, for example, a 6, 12, or 24 volt battery, although other voltages are possible. The power source may alternatively be some other source of voltage such as a generator.

The device 466 is configured to receive a voltage at an input interface of a device, transition alerting mode logic of the device from a non-alerting mode to an alerting mode in response to the voltage, which is received at the input interface and detected by a voltage detector, exceeding a threshold voltage, transition the alerting mode logic of the device from the alerting mode back to the non-alerting mode in response to the voltage, which is received at the input interface and detected by the voltage detector, not exceeding the threshold voltage for an entire delay interval, and transmit alerting vehicle telemetry data, which includes location information generated by a GPS unit of the device, in response to the alerting mode of the alerting mode logic.

In the example of FIG. 4, the battery 464 is electrically connected to the light controller 462 and to the device 466, and the light controller is electrically connected to the warning light 460 and to the device. In an example, the electrical connections are made via conductive wiring, although the electrical connections may be made by some other conductive paths. As shown in FIG. 4, the warning light and the device are both electrically connected to the output of the light controller and thus when the light controller outputs a light driver signal 468 as a voltage, both the warning light and the device receive the same light driver signal. Although both the warning light and the device receive the same light driver signal from the light controller, the voltage of the signal received at the warning light and at the device may be different, for example, due to transmission loses or other intervening components.

Figure 5A:
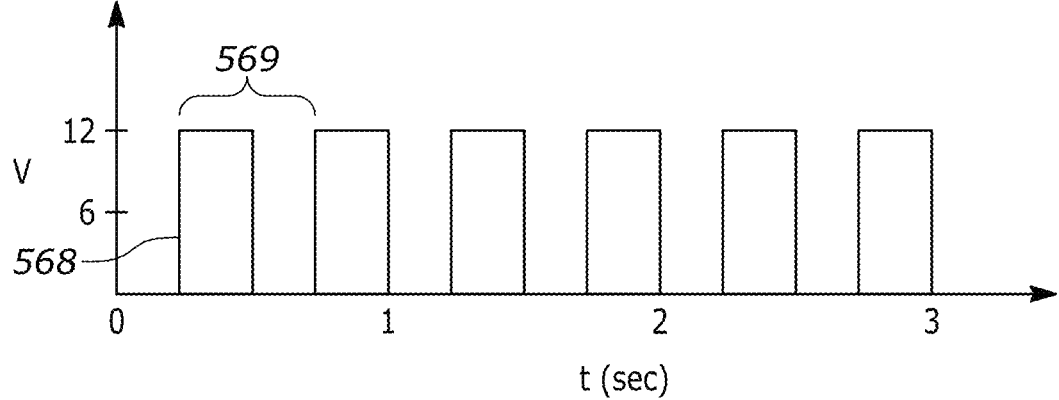
FIG. 5A depicts an example of a light driver signal that is output from a light controller when the warning light system is in an activation state.

As described above, the light controller 462 outputs a light driver signal when the warning light system 458 is put into an activation state (e.g., turned on). FIG. 5A depicts an example graph of a light driver signal 568 that is output from the light controller when the warning light system is in an activation state. In the example, the light driver signal changes back and forth between a low voltage (e.g., approximately 0 V) and a high voltage (e.g., approximately 12 V) in a periodic or cyclical manner, with each period 569 or cycle lasting, for example, 0.5 seconds.

Figure 5B:
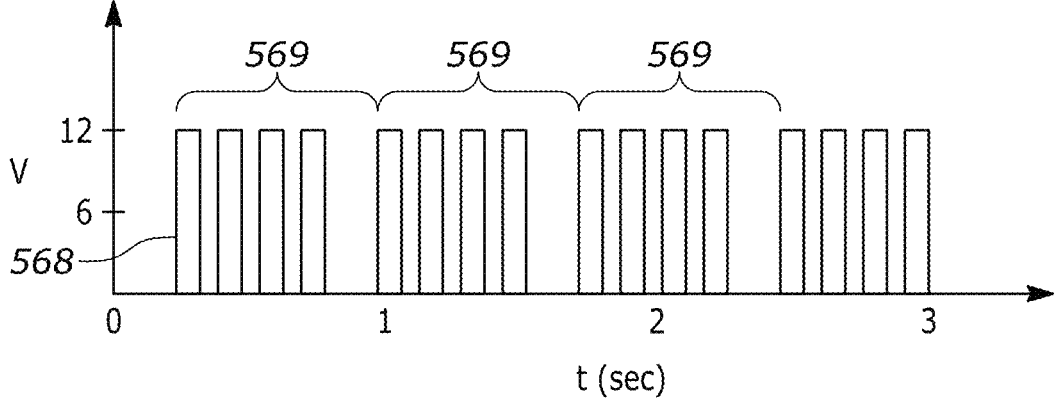
FIG. 5B is an example another pattern of a light driver signal that is output from a light controller when the warning light system is in an activation state.

In the example of FIG. 5A, the light driver signal 568 is shown as a square wave for description purposes, but the actual light driver signal may not be such a precise square wave. Additionally, although a period of 0.5 seconds is provided as an example, the light driver signal may oscillate between a high voltage and a low voltage in other patterns that may be used to achieve different flashing light patterns. FIG. 5B is an example graph of another pattern of the light driver signal 568. In the example of FIG. 5B, the light driver signal oscillates in a repeating pattern that includes a first period 569 having a burst of closely spaced (in time) high voltage intervals followed by an interval of low voltage, followed by a second period having a burst of closely spaced high voltage intervals followed by an interval of low voltage, and so on. Although FIGS. 5A and 5B both illustrate examples of light driver signals with repeating patterns (e.g., periods) of high and low voltages, the light driver signal may have random oscillations in voltage.

As described above, the device 466 is configured to transition from a non-alerting mode to an alerting mode when a detected voltage exceeds a voltage threshold and to transition from the alerting mode back to the non-alerting mode when the detected voltage does not exceed the threshold voltage for an entire delay interval. The delayed transition back to the non-alerting mode allows for the use of a simple connection to the light driver signal to determine the activation state of the warning light but avoids a situation in which the alerting mode logic transitions back to the non-alerting mode every time the voltage of the light driver signal goes low.

Figure 6A:
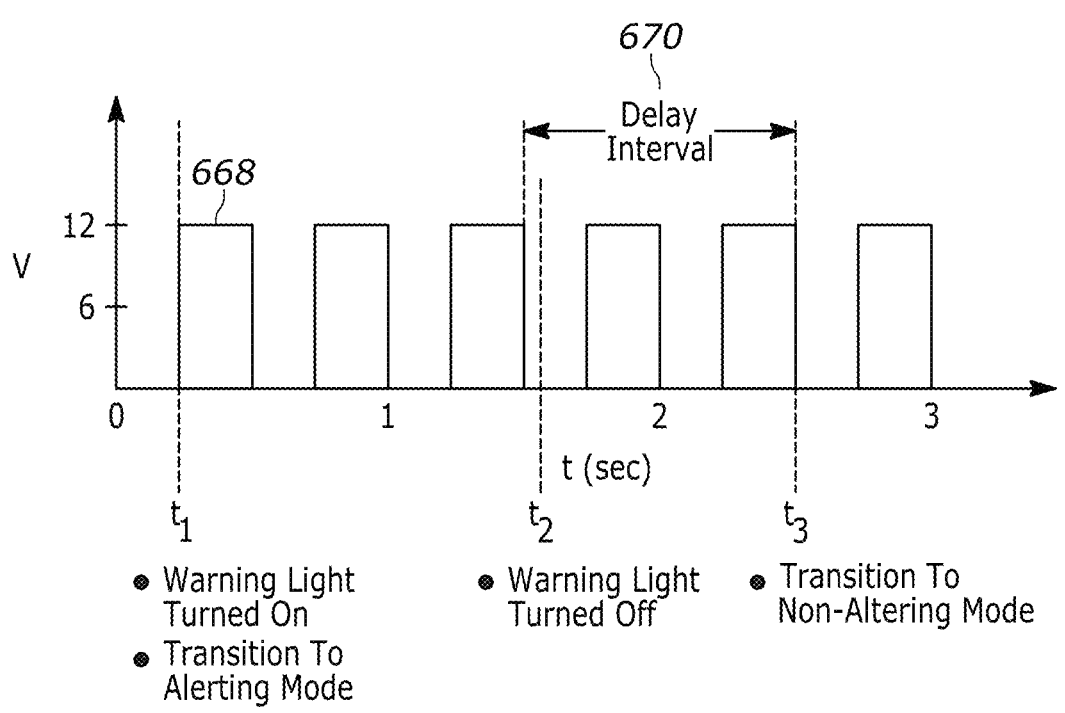
FIG. 6A illustrates operation of alerting mode logic relative to a light driver signal that oscillates similar to the light driver signal described with reference to FIG. 5A.

FIG. 6A illustrates an example operation of the alerting mode logic relative to a light driver signal 668 that oscillates similar to the light driver signal 568 described with reference to FIG. 5A. The warning light system is turned on (e.g., put into an activation state) at time T1, which causes an oscillating light driver signal to be output from the light controller and received at the warning light and at the device. In response to detecting the light driver signal at the device, the alerting mode logic of the device transitions from a non-alerting mode to an alerting mode. In an example, once the alerting mode logic is in the alerting mode, the device is configured to transmit location information to the safety cloud at an increased frequency (e.g., once every second instead of once every 15 seconds) and to include a value in an alert ID field that indicates that the warning light system is on. At some point in time after the time, T1, the warning light system is turned off (e.g., put into a non-activation state). For example, the warning light system is turned off at time, T2. Although the warning light system is turned off at time, T2, the alerting mode logic does not transition to the non-alerting mode until the light driver signal has not been detected at the device for an entire delay interval. An example of the delay interval 670 is illustrated in FIG. 6A. Upon the light driver signal going low (e.g., when the light driver signal drops below a voltage threshold), time that has elapsed since the light driver signal went low begins to be tracked. In an example, the voltage threshold is 6 V so time begins to be tracked each time the light driver signal drops below 6 V, although 6 V is only an example of the voltage threshold. Once the entire delay interval has passed and the light driver signal has not been detected above the threshold voltage at any time during the entire delay interval, the alerting mode logic transitions to the non-alerting mode. In an example, when the alerting mode logic is in the non-alerting mode, the device transmits location information to the safety cloud at a lower frequency (e.g., once every 15 seconds as opposed to once every second). Because the alerting mode logic does not transition back to the non-alerting mode until the entire delay interval has passed with no signal detected (e.g., no light driver signal detected above the threshold voltage), the alerting mode logic does not prematurely transition to the non-alerting mode due to a momentary drop in the voltage of the light driver signal, which momentary drop in voltage is part of the intended pattern of an active light driver signal.

Figure 6B:
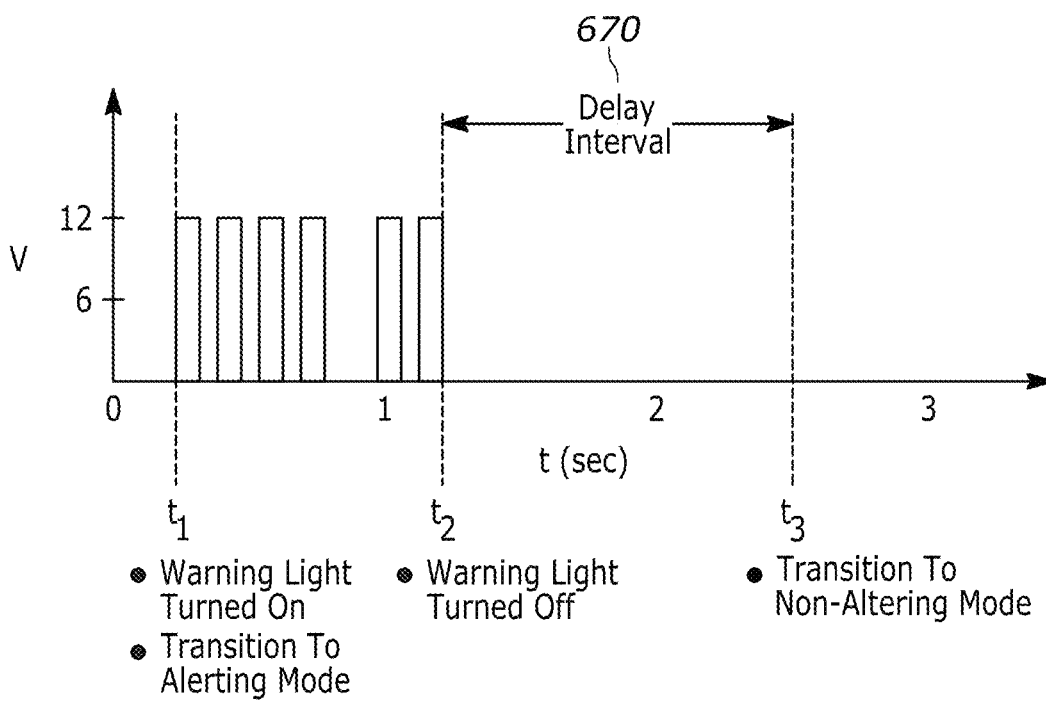
FIG. 6B illustrates operation of alerting mode logic relative to a light driver signal that oscillates similar to the light driver signal described with reference to FIG. 5B.

FIG. 6B illustrates operation of the alerting mode logic relative to a light driver signal 668 that oscillates similar to the light driver signal described with reference to FIG. 5B. The warning light system is turned on (e.g., put into an activation state) at time T1, which causes an oscillating light driver signal to be output from the light controller and received at the warning light and at the device. In response to detecting the light driver signal at the device, the alerting mode logic of the device transitions from a non-alerting mode to an alerting mode. In an example, once the alerting mode logic is in the alerting mode, the device is configured to transmit location information to the safety cloud at an increased frequency (e.g., once every second instead of once every 15 seconds) and to include a value in an alert ID field that indicates that the warning light system is on. At some point in time after the time, T1, the warning light system is turned off (e.g., put into a non-activation state). For example, the warning light system is turned off at time, T2. Although the warning light system is turned off at time, T2, the alerting mode logic does not transition to the non-alerting mode until the light driver signal has not been detected at the device for an entire delay interval. An example of the delay interval

670 is illustrated in FIG. 6B. Upon the light driver signal going low (e.g., when the light driver signal drops below a voltage threshold), time that has elapsed since the light driver signal went low begins to be tracked. In an example, the voltage threshold is 6 V so time begins to be tracked each time the light driver signal drops below 6 V. Once the entire delay interval has passed and the light driver signal has not been detected above the threshold value at any time during the entire delay interval, the alerting mode logic transitions to the non-alerting mode. In an example, when the alerting mode logic is in the non-alerting mode, the device transmits location information to the safety cloud at a lower frequency (e.g., once every 15 seconds as opposed to once every second). Because the alerting mode logic does not transition back to the non-alerting mode until the entire delay interval has passed with no signal detected (e.g., no light driver signal detected above the threshold voltage), the alerting mode logic does not prematurely transition to the non-alerting mode due to a momentary drop in the voltage of the light driver signal, which momentary drop in the voltage is part of the intended pattern of an active light driver signal.

As shown in FIGS. 6A and 6B, the tracking of elapsed time relative to the delay interval is not dependent on when the warning light system is turned off, rather tracking of the elapsed time relative to the delay interval is triggered by the light driver signal going low (e.g., falling below a threshold voltage). In an example, the time that has elapsed since the light driver signal went low (e.g., dropped below the threshold voltage) is tracked anew each time the light driver signal goes low (e.g., each time the light driver signal drops below the voltage threshold). In an example, the voltage detector circuit is configured to output a signal indicating that the voltage has dropped below the threshold voltage each time the detected voltage drops below the voltage threshold, and the signal triggers a timer within the microcontroller to start. In an example, the timer tracks the time until either 1) the light driver signal goes high (e.g., exceeds the voltage threshold), or the delay interval is reached (e.g., the entire delay interval has passed), which causes the alerting mode logic to transition back to the non-alerting mode. In an example, the timer is reset each time the detected voltage exceeds the threshold voltage and whenever the delay interval is reached, which causes the alerting mode logic to transition back to the non-alerting mode.

As illustrated above with reference to FIGS. 6A and 6B, the delay interval 670 should be at least longer than the longest off interval that occurs in the oscillating pattern of the light driver signal 668. That is, while in an activation state (e.g., the warning light is on), the light driver signal has planned intervals of low voltage (e.g., 0 V) and the delay interval should be longer than the longest planned interval of low voltage so that the alerting mode logic does not immediately transition from alerting mode to non-alerting mode upon detecting the low voltage. In an example, the delay interval can be extended beyond the longest planned interval of low voltage in the oscillating pattern to ensure some margin of error against prematurely transitioning from the alerting mode to the non-alerting mode. In an example, when the oscillating pattern is similar to the pattern described with reference to FIG. 5A, the delay period may by a few cycles of the repeating pattern, e.g., four 0.5 second cycles for a delay interval of two seconds. In an example, the delay interval may be programmed into the alerting mode logic based on knowledge of the pattern of the light driver signal. In an example, the delay interval may be selectable from a set of preprogrammed delay intervals based on some characteristic. For example, the delay interval may be selected from a set of preprogrammed delay intervals based on the type of flashing light pattern of the vehicle in which the device is installed, or is to be installed. In another example, the delay interval may be learned by the alerting mode logic based on observing the voltage fluctuations of the light driver signal over some period of time.

Figure 7:
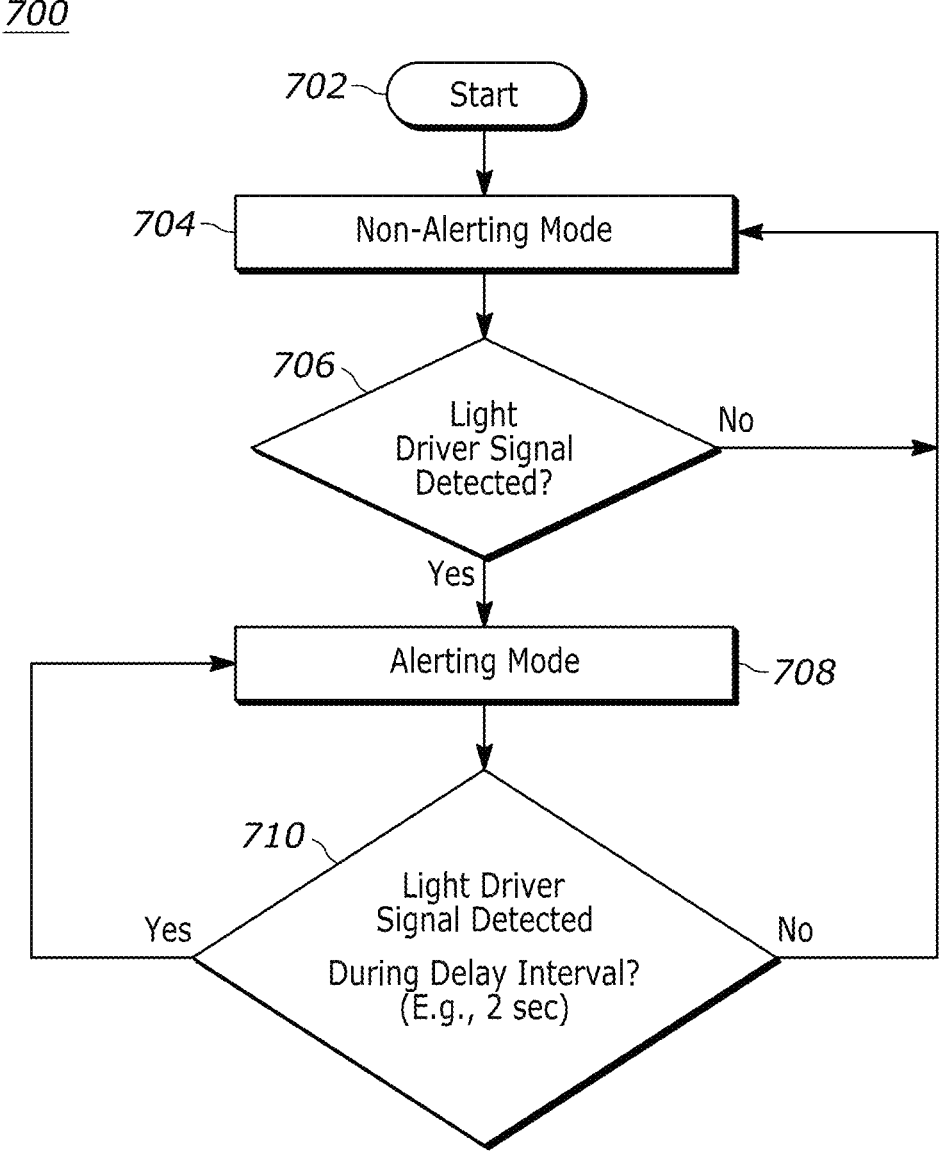
FIG. 7 is an example process flow diagram of alerting mode logic that can be implemented by a device that is installed in a vehicle.

FIG. 7 is an example process flow diagram 700 of alerting mode logic that is implemented by the device. Upon starting the process at 702, the alerting mode logic is in a non-alerting mode, block 704. At decision point 706, it is determined if a light driver signal is detected. In an example, the light driver signal is a 12 V signal and the light driver signal is detected when a detected voltage exceeds a voltage threshold, for example, exceeds 6 V (50% of 12 V). In an example, the voltage detector has a very fast cycle time, e.g., on the order of one voltage detection every 0.1 seconds. If a light driver signal is not detected, then the alerting mode logic stays in the non-alerting mode, e.g., returns to block 704. In an example, the alerting mode logic detects the voltage at a frequency of 0.1 seconds, e.g., at a frequency that is orders of magnitude larger than the delay interval. If at decision point 706, a light driver signal is detected, then the alerting mode logic transitions to the alerting mode at block 708. Once in the alerting mode, the alerting mode logic continues to monitor the light driver signal. At decision point 710, it is determined if the light driver signal has been detected at any point during a delay interval, for example, a delay interval of 2 seconds. For example, it is determined whether or not a voltage greater than the threshold voltage (e.g., 6 V) has been detected at any time since the voltage dropped below the threshold voltage. If the light driver signal has been detected at any time during the delay interval, then the alerting mode logic stays in the alerting mode, e.g., the process returns to block 708. However, if the light driver signal has not been detected at any time during the entire delay interval, then the alerting mode logic transitions back to the non-alerting mode, e.g., the process returns to block 704. Thus, the delay in transitioning back to the non-alerting mode enables the light driver signal to be used as an indication of the state of the warning light system without causing the alerting mode logic to transition to a non-alerting state every time the voltage of the light driver signal goes low. In an example, the tracking of elapsed time is reset each time the detected voltage exceeds the threshold voltage and whenever the alerting mode logic transitions from the alerting mode back to the non-alerting mode.

In an example, the device is configured to transmit alerting vehicle telemetry data to the safety cloud based on whether the device is in an alerting mode or a non-alerting mode. For example, when in a non-alerting mode, the device is configured to transmit location information at a lower frequency of reporting than when in an alerting mode, e.g., when in non-alerting mode the device transmits one alerting vehicle data message every 15 seconds and when in alerting mode the device transmits one alerting vehicle data message every second. Additionally, when in non-alerting mode the alert ID field of the alerting vehicle data message indicates that the vehicle is in a non-activation state (e.g., the warning lights are off) and when in an alerting mode the alert ID field of the alerting vehicle data message indicates that the vehicle is in an activation state (e.g., the warning lights are on). In an example, the safety cloud establishes alerting zones in response to the value in the alert ID field of the alerting vehicle data messages. For example, the safety cloud establishes an alerting zone and sends alert messages to vehicles within the alerting zone when the value in the alert ID field indicates that the alerting vehicle has its warning lights on. Further, the safety cloud may end an alerting zone and stop sending the corresponding alerting messages when the value in the alert ID field indicates that the alerting vehicle no longer has its warning lights on.

Figure 8:
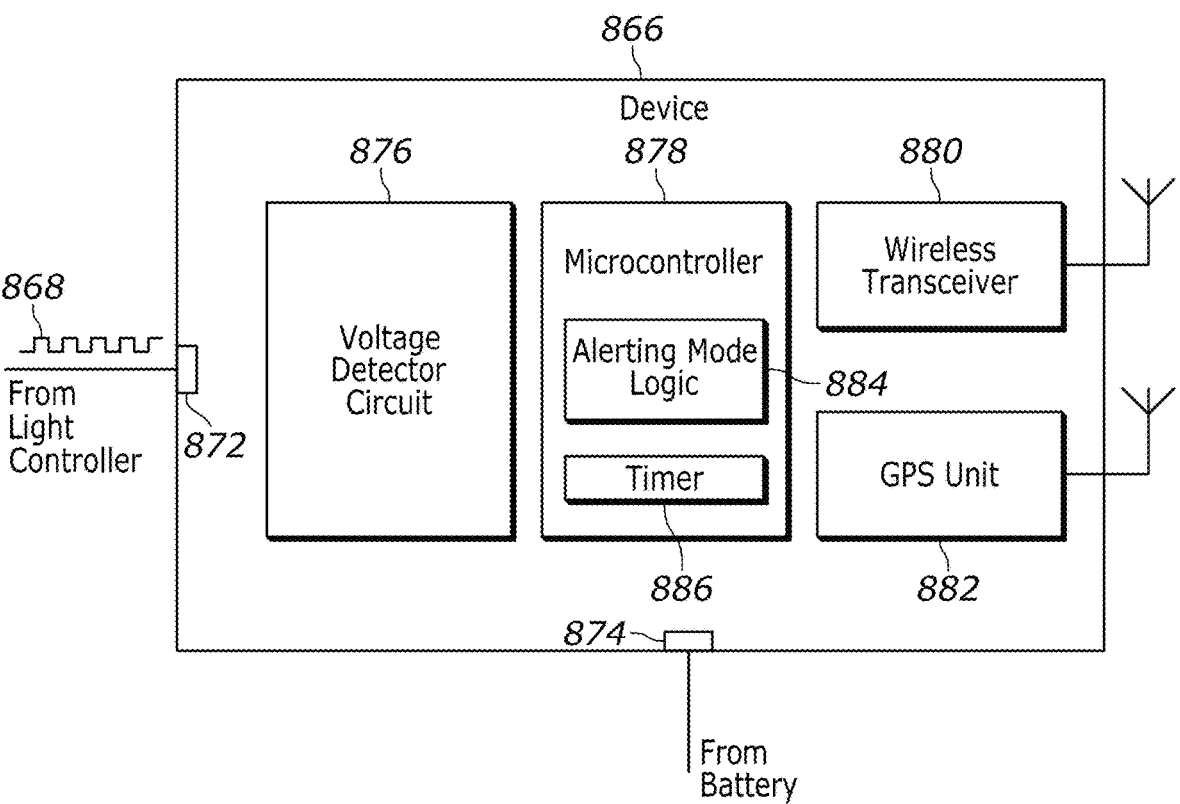
FIG. 8 is an example of a device that is configured to implement vehicle data reporting with alerting mode logic that incorporates a delay interval.

FIG. 8 is an example of a device 866 that is configured to implement vehicle data reporting with alerting mode logic that incorporates a delay interval as described herein. As shown in the example of FIG. 8, the device includes an input voltage interface 872, a power interface 874, a voltage detector circuit 875, a microcontroller 878, a wireless transceiver 880, and a GPS unit 882.

In an example, the input voltage interface 872 of the device 866 is a wire that extends from the device and is electrically coupled to the voltage detector circuit 876. The wire can be coupled to a wire that carries the light driver signal using for example a twist-on wire connector. In another embodiment, the input voltage interface is a connector that is accessible externally from the body of the device and configured to electrically connect to a wire, or wires, that is electrically connected to the light controller and conducts the light driver signal 868. In an example, the voltage input interface may be a screw around which a wire can be wrapped and then the screw is tightened to hold the wire in place and to create an electrical connection. Other types of interfaces are also possible.

The power interface 874 of the device 866 is configured to electrically connect the power source (e.g., a battery of the vehicle) to the device. In an example, the power interface includes two wires that protrude from the device to enable physical and electrical connection to two other wires. One of the other wires being electrically connected to the battery and the other of the two wires being electrically connected to ground. In another example, the power interface may be a connector that electrically connects to two conductive wires, with one wire being electrically connected to the positive battery terminal and the other wire being connected to the negative battery terminal. In another example, the input voltage interface 872 and the power interface 874 are combined into a single connector that includes conductive paths for the battery voltage (positive and negative) and the light driver signal.

The voltage detector circuit 876 of the device 866 is configured to detect voltage at the input voltage interface 872. In an example, the voltage detector circuit is configured to detect voltages in a range that is compatible with the expected voltage range of the light driver signal 868. In an example, the voltage detector circuit is configured to detect when a voltage threshold has been crossed (e.g., exceeded a voltage threshold or dropped below a voltage threshold) and to output a signal when a voltage threshold has been crossed. In an example, the voltage detector is configured to output a signal that indicates that the detected voltage has exceeded a voltage threshold and to output a signal that indicates that the detected voltage has dropped below a voltage threshold. In an example, the voltage threshold may be a single voltage threshold, such as some percentage of the expected maximum voltage. For example, when the input voltage interface is electrically connected to a 12 V source, the voltage threshold may be set to 6 V (e.g., 50% of the maximum voltage) or to 10.8 V (e.g., 90% of the max voltage), although other thresholds are possible. In other examples, the voltage detection circuit may be configured with a first voltage threshold (e.g., 90% of the maximum voltage) and a second voltage threshold (e.g., 20% of the maximum voltage), and further configured to output a first signal that indicates that the detected voltage has exceeded the first voltage threshold and to output a second signal that indicates that the detected voltage has dropped below the second voltage threshold. Such a configuration can be used to dampen the response of the voltage detector circuit.

The microcontroller 878 of the device 866 is configured to implement alerting mode logic 884 as is described herein. For example, the microcontroller is configured to implement that logic as described with reference to FIGS. 6A, 6B, and 7. The microcontroller may implement the alerting mode logic in hardware, software, firmware, or some combination thereof. In an example, microcontroller includes a timer 886 that is configured to track elapsed time after the light driver signal 868 goes low, e.g., drops below a voltage threshold. The microcontroller is also configured to manage data reporting to the safety cloud. For example, the microcontroller may control the frequency of transmissions of alerting vehicle telemetry data from the wireless transceiver 880 and the substance of the vehicle alerting telemetry data. The logic implemented by the microcontroller may be implemented in some other device or devices in other examples.

The wireless transceiver 880 of the device 866 is configured to transmit data over a wireless channel as is known in the field of wireless communications. For example, the wireless transceiver includes an antenna and may use cellular, 4G, 5G, Wi-Fi, satellite, and/or short range wireless communications protocols as is known in the field. In an example, the wireless transceiver may be only capable of transmitting data and not receiving data. However, it is likely that the wireless transceiver has both transmit and receive capability.

The global positioning system (GPS) unit 882 of the device 866 is configured to obtain position information, e.g., latitude and longitude coordinates. The GPS unit may be a GPS unit that includes and antenna as is known in the field. The GPS unit may obtain information from satellites and/or from other terrestrial devices.

In an example, the wireless transceiver 880, the GPS unit 882, and the microcontroller 878 are implemented in separate devices, such as separate integrated circuit (IC) devices. However, in other examples, the wireless transceiver, the GPS unit, and/or the microcontroller may be integrated onto a single IC device. Likewise, the voltage detector circuit 876 may be integrated completely or partially with the microcontroller.

Figure 9:
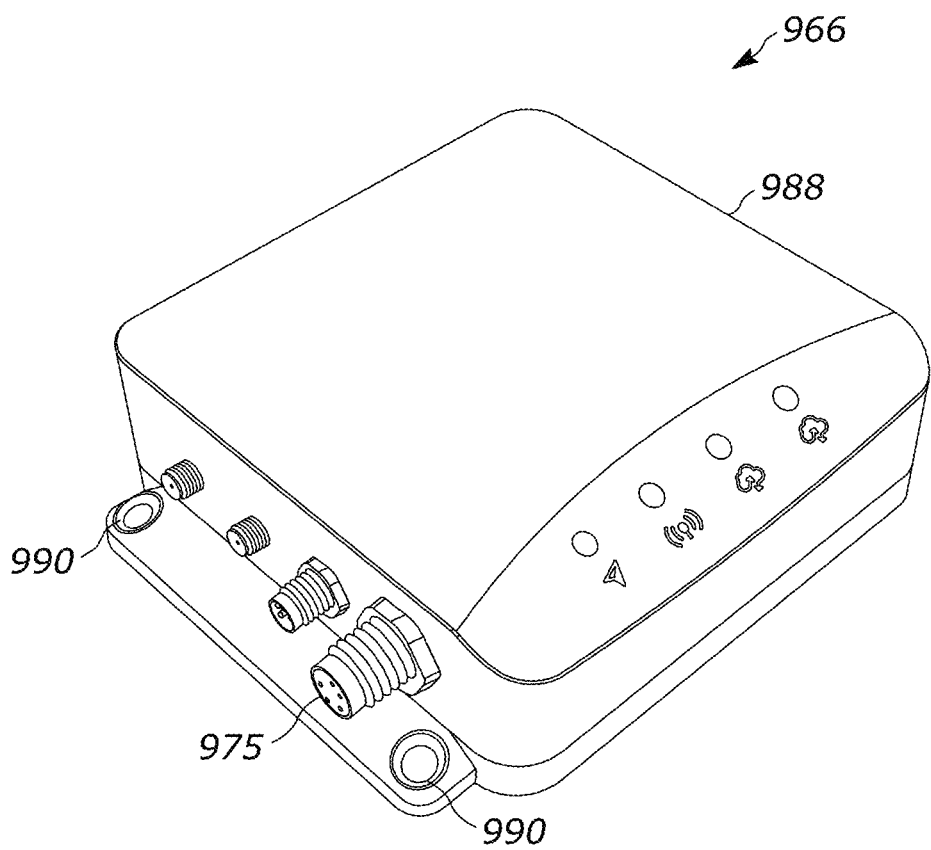
FIG. 9 is a perspective view of an example device that can be attached to a vehicle.

FIG. 9 is a perspective view of an example device 966, similar to the device 466 and 866 described with reference to FIGS. 4 and 8, respectively, that can be attached to a vehicle. In the example, the device is a standalone device that includes a body 988 and attachment elements 990. For example, the device may be attached to a vehicle via screws that pass through the attachment elements of the body and screw into a part of the vehicle. In an example, the voltage detector circuit, the microcontroller, the wireless transceiver, and GPS unit are encapsulated within the body and the input voltage interface and the power interface are combined into a single connector 975, which is accessible from outside of the body. The device may also include other interfaces, such as antenna interfaces and other communications interfaces.

Figure 10:
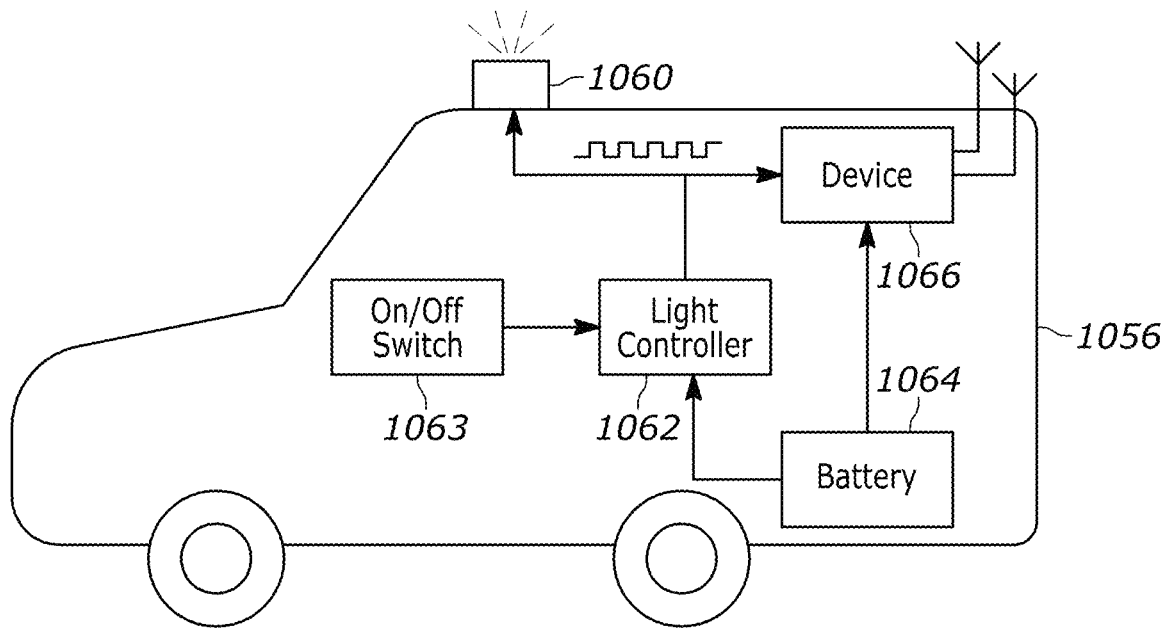
FIG. 10 depicts an example of a vehicle that is equipped with elements similar to the elements described with reference to FIGS. 4, 8, and 9.

FIG. 10 depicts an example of a vehicle 1056 that is equipped with a warning light 1060, a light controller 1062, an on/off switch 1063, a battery 1064, and a device 1066 as described with reference to FIGS. 4, 8, and 9. In an example, the device as described with reference to FIG. 9 is attached to the vehicle via the attachment elements, the device is electrically connected to the battery via the power interface, and the device is electrically connected to the light controller via the input voltage interface.

Although warning lights are described, the above described techniques are also applicable to a warning siren. For example, a siren driver signal may be used as an indication of the activation state of an alerting vehicle, and the siren light driver signal may have an oscillating voltage to produce a particular sound pattern.

In an example, the motion information corresponding to a vehicle may be generated at the safety cloud based on location information in the vehicle telemetry data. For example, the safety cloud may maintain a trajectory history for each vehicle in a vehicle tracking database and use the trajectory history to make a most probable path prediction.

In an example, telemetry data is data that is generated at a device (e.g., an on-board vehicle computer and/or a personal computing device, such as a smartphone) and wirelessly transmitted from the device to a collection device for further analysis and/or processing. In an example, the device includes at least one sensor, such as a GPS receiver and/or light activation state sensor, that is configured to generate the telemetry data and a wireless transceiver to transmit the telemetry data. In one example, the telemetry data is generated and transmitted at fixed intervals.

In an example, the vehicles, including the alerting vehicles and the non-alerting vehicles, are equipped with a GPS receiver to generate the vehicle telemetry data (e.g., including location and motion information) and a wireless communications transceiver (e.g., 3G, 4G, 5G transceivers) to transmit the vehicle telemetry data from the vehicle to a base station. The vehicle telemetry data can be then be sent from the base station to the safety cloud via known networking communications technologies.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It is understood that the scope of the protection for systems and methods disclosed herein is extended to such a program and in addition to a computer readable means having a message therein, such computer readable storage means contain program code means for implementation of one or more steps of the method, when the program runs on a server or mobile device or any suitable programmable device.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

While the above-described techniques are described in a general context, those skilled in the art will recognize that the above-described techniques may be implemented in software, hardware, firmware, or a combination thereof. The above-described embodiments of the invention may also be implemented, for example, by operating a computer system to execute a sequence of machine-readable instructions. The instructions may reside in various types of computer readable media. In this respect, another aspect of the present invention concerns a programmed product, comprising computer readable media tangibly embodying a program of machine-readable instructions executable by a digital data processor to perform the method in accordance with an embodiment of the present invention.

The computer readable media may comprise, for example, random access memory (not shown) contained within the computer. Alternatively, the instructions may be contained in another computer readable media such as a magnetic data storage diskette and directly or indirectly accessed by a computer system. Whether contained in the computer system or elsewhere, the instructions may be stored on a variety of machine-readable storage media, such as a direct access storage device (DASD) storage (e.g., a conventional "hard drive" or a Redundant Array of Independent Drives (RAID) array), magnetic tape, electronic read-only memory, an optical storage device (e.g., CD ROM, WORM, DVD, digital optical tape), paper "punch" cards. In an illustrative embodiment of the invention, the machine-readable instructions may comprise lines of compiled C, C++, or similar language code commonly used by those skilled in the programming for this type of application arts.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the claims as described herein.

What is claimed is:

1. A device comprising:
a global positioning system (GPS) unit;
a wireless transmitter;
an input voltage interface;
a voltage detector circuit electrically connected to the input voltage interface and configured to detect a voltage at the input voltage interface; and
alerting mode logic configured to;
transition from a non-alerting mode to an alerting mode in response to the voltage detected by the voltage detector circuit exceeding a threshold voltage; and
transition from the alerting mode back to the non-alerting mode in response to the voltage detected by the voltage detector circuit not exceeding the threshold voltage for an entire delay interval;
wherein the wireless transmitter is configured to transmit alerting vehicle telemetry data, which includes location information generated by the GPS unit, in response to the alerting mode of the alerting mode logic.

2. The device of claim 1, wherein the alerting vehicle telemetry data includes a value that is indicative of the alerting mode.

3. The device of claim 1, wherein the alerting vehicle telemetry data includes a value that is indicative of a state of a warning light in response to the alerting mode of the alerting mode logic, wherein, when the alerting mode logic is in the non-alerting mode, the value indicates that the warning light is off, and when the alerting mode logic is in the alerting mode, the value indicates that the warning light is on.

4. The device of claim 1, wherein the voltage detector circuit is configured to:

generate a signal that indicates the voltage detected by the voltage detector circuit has exceeded the threshold voltage; and generate a signal that indicates the voltage detected by the voltage detector circuit has dropped below the threshold voltage.

5. The device of claim 4, further including a timer to track time that has elapsed since the voltage detected by the voltage detector circuit dropped below the voltage threshold.

6. The device of claim 1, wherein the alerting vehicle telemetry data is transmitted in vehicle data messages and more vehicle data messages are transmitted per unit of time when in the alerting mode than when in the non-alerting mode.

7. The device of claim 1, wherein the delay interval is configured to be longer than a period of a periodic light driver signal.

8. The device of claim 1, wherein the input voltage interface is configured to connect to a wire that carries a light driver signal for a warning light of a vehicle.

9. The device of claim 1, wherein the alerting mode logic is further configured to transmit a value in a vehicle data message that is indicative of the alerting mode of the alerting mode logic.

10. The device of claim 1, further comprising a body, wherein the GPS unit, the wireless transmitter, the voltage detector circuit, and the alerting mode logic are embedded within the body, and wherein the input voltage interface includes an electrical connector that is accessible from outside of the body.

11. A method comprising:
receiving a voltage at an input interface of a device;
transitioning alerting mode logic of the device from a non-alerting mode to an alerting mode in response to the voltage, which is received at the input interface and detected by a voltage detector, exceeding a threshold voltage;
transitioning the alerting mode logic of the device from the alerting mode back to the non-alerting mode in response to the voltage, which is received at the input interface and detected by the voltage detector, not exceeding the threshold voltage for an entire delay interval; and
transmitting alerting vehicle telemetry data, which includes location information generated by a GPS unit of the device, in response to the alerting mode of the alerting mode logic.

12. The method of claim 11, wherein the voltage is an oscillating voltage of a light driver signal and the delay interval is at least longer than one period of the oscillating voltage.

13. The method of claim 11, wherein the alerting vehicle telemetry data includes a value that is indicative of the alerting mode and the location information includes latitude and longitude coordinates of the vehicle.

14. The method of claim 11, wherein the alerting vehicle telemetry data includes a value that is indicative of a state of a warning light in response to the alerting mode of the alerting mode logic, wherein, when the alerting mode logic is in the non-alerting mode, the value indicates that the warning light is off, and when the alerting mode logic is in the alerting mode, the value indicates that the warning light is on.

15. The method of claim 11, wherein the voltage detector is configured to:

generate a signal that indicates the voltage detected by the voltage detector has exceeded the threshold voltage; and generate a signal that indicates the voltage detected by the voltage detector has dropped below the threshold voltage.

16. The method of claim 15, further including tracking time that has elapsed since the voltage detected by the voltage detector dropped below the voltage threshold.

17. The method of claim 11, wherein the alerting vehicle telemetry data is transmitted in vehicle data messages and more vehicle data messages are transmitted per unit of time when in the alerting mode than when in the non-alerting mode.

18. The method of claim 11, wherein the delay interval is configured to be longer than a period of a periodic light driver signal.

19. A device comprising:

a global positioning system (GPS) unit;

a wireless transmitter;

an input voltage interface;

a voltage detector circuit electrically connected to the input voltage interface and configured to detect a voltage at the input voltage interface; and a microcontroller configured to;

implement alerting mode logic that transitions from a non-alerting mode to an alerting mode in response to the voltage detected by the voltage detector circuit exceeding a threshold voltage, and transitions from the alerting mode back to the non-alerting mode in response to the voltage detected by the voltage detector circuit not exceeding the threshold voltage for an entire delay interval; and manage transmission of alerting vehicle telemetry data, which includes location information generated by the GPS unit, in response to the alerting mode of the alerting mode logic.

20. The device of claim 19, wherein:

the alerting vehicle telemetry data includes a value that is indicative of a state of a warning light in response to the alerting mode of the alerting mode logic, wherein, when the alerting mode logic is in the non-alerting mode, the value indicates that the warning light is off, and when the alerting mode logic is in the alerting mode, the value indicates that the warning light is on; and the microcontroller is configured to cause vehicle data messages carrying alerting vehicle telemetry data to be transmitted at a first rate in non-alerting mode and to cause vehicle data messages carrying alerting vehicle telemetry data to be transmitted at a second rate in alerting mode, wherein the second rate is greater than the first rate, and the first and second rates correspond to a number of vehicle data messages per unit of time.

* * * * *